United States Patent [19]

Frodsham

[11] 4,089,762
[45] May 16, 1978

[54] PHOTOPOLYMERIZABLE COMPOSITIONS

[75] Inventor: Thomas William Gordon Frodsham, Billingham, England

[73] Assignee: Imperial Chemical Industries Limited, London, England

[21] Appl. No.: 578,313

[22] Filed: May 16, 1975

[30] Foreign Application Priority Data

May 23, 1974 United Kingdom ............... 23019/74

[51] Int. Cl.² ........................... C08F 8/00; C08F 2/46
[52] U.S. Cl. ........................... 204/159.15; 204/159.23; 260/864; 427/54
[58] Field of Search ...................... 204/159.15, 159.23; 427/54; 260/864

[56] References Cited

U.S. PATENT DOCUMENTS

| 3,450,613 | 6/1969 | Steinberg | 204/159.15 |
| 3,551,311 | 12/1970 | Nass et al. | 204/159.18 |
| 3,759,807 | 9/1973 | Osborn et al. | 204/159.23 |
| 3,864,133 | 2/1975 | Hisamatsu et al. | 96/115 P |
| 3,903,322 | 9/1975 | Ravve et al. | 427/54 |

FOREIGN PATENT DOCUMENTS 861,429  2/1961  United Kingdom ................... 427/54

Primary Examiner—Murray Tillman
Assistant Examiner—Thurman K. Page
Attorney, Agent, or Firm—Cushman, Darby & Cushman

[57] ABSTRACT

A photopolymerizable composition comprises a polymerizable ethylenically unsaturated material, a photosensitizer

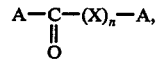

which is preferably a diketone, e.g. benzil, and a N-alkyl or N-cycloalkylmorpholine.

6 Claims, No Drawings

PHOTOPOLYMERIZABLE COMPOSITIONS

The present invention relates to photopolymerisable compositions comprising ethylenically unsaturated polymerisable monomers and catalysts for the polymerisation which are capable of being initiated by visible or ultra-violet light.

In British patent application No. 48365/71, 9307/72 (equivalent to published German OLS 2,251,048), we have described and claimed a photopolymerisable composition comprising at least one polymerisable ethylenically unsaturated material and a photosensitive catalyst comprising:

(a) at least one photosensitiser having the structure

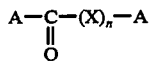

where X is $> C = O$, $> CR_1R_2$ or $> CR_3OR_4$, where $R_1$ to $R_4$ which may be the same or different, are hydrogen or hydrocarbyl groups, n is 0 or 1, and the Groups A, which may be the same or different, are hydrocarbyl or substituted hydrocarbyl groups, the Groups A being aromatic or substituted aromatic when n is 1 and X is $> CR_1R_2$ and when n is 0, and (b) at least one reducing agent capable of reducing the photosensitiser when the photosensitiser is in an excited state.

The photosensitisers of class (a) are exemplified in the British patent application by alpha-di-ketones such as benzil and by aromatic monoketones such as benzophenone, and the reducing agents of class (b) are illustrated by primary, secondary or tertiary amines and phosphines such as mono-n-butylamine and triethylamine.

We have now found a group of reducing agents which are generally covered by the claims of the aforesaid British patent application but which are not specifically described therein. The use of these reducing agents gives photosensitive catalyst compositions which are very active and which give a rapid rate of cure.

Accordingly, the invention is a photopolymerisable composition which comprises at least one polymerisable ethylenically unsaturated material and a photosensitive catalyst comprising:

(a) at least one photosensitiser having the structure

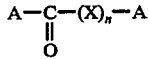

I where X is $> C = O$, $> CR_1R_2$ or $> CR_3OR_4$ where $R_1$ to $R_4$ which may be the same or different are hydrogen or hydrocarbyl groups, n is 0 or 1, and the Groups A, which may be the same or different, are hydrocarbyl or substituted hydrocarbyl groups, or together form a fused aromatic ring system, and where the Groups A may be further linked together by a direct link or by a divalent group, the Groups A being aromatic or substituted aromatic when n is 1 and X is $> CR_1R_2$, and when n is 0, and (b) a reducing agent which is a N-alkyl or N-cycloalkyl morpholine.

In general the groups A in the photosensitiser will be aliphatic or aromatic and it is to be understood that the groups A may be the same or different, that is, for example, in the photosensitiser of structure I both groups A may be aromatic, or both may be aliphatic, or one group A may be aromatic and the other aliphatic provided that when n is 1 and X is $> CR_1R_2$, and when n is 0, both groups A are aromatic. However, for reasons of convenience in the preparation of the photosensitiser the groups A are preferably the same.

Within the scope of the term aliphatic groups we include cycloaliphatic groups and aliphatic groups carrying aromatic substituents, that is, alkaryl groups. Similarly, within the scope of the term aromatic group we include groups carrying alkyl substituents, that is, aralkyl groups.

The aromatic group may be benzenoid aromatic group, e.g. the phenyl group, or it may be a nonbenzenoid cyclic group which is recognised in the art as possessing the characteristics of a benzenoid aromatic group.

The groups A, especially when aromatic, may carry substituent groups other than hydrocarbyl, e.g. halogen or alkoxy, provided the photosensitiser containing the substituents groups is not present in the photopolymerisable composition in such a concentration as to result in substantial inhibition of polymerisation of the ethylenically unsaturated material in the composition.

In the photosensitiser having the structure I the group X preferably has the structure $> C = O$ or $> CR_3OR_4$ where $R_3$ and $R_4$ are as hereinbefore described.

The groups $R_1$, $R_2$, $R_3$, and $R_4$ may be hydrogen or hydrocarbyl groups, for example alkyl. Preferably the groups $R_1$ to $R_4$ are hydrogen.

In the photosensitiser having the structure I the groups A may be further linked together by a direct link, or by a divalent group, e.g. a divalent hydrocarbyl group, that is, in addition to the link through the group

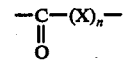

the groups A may be furlinked so as to form a cyclic ring system. For example, where the groups A are aromatic the photosensitiser may have the structure

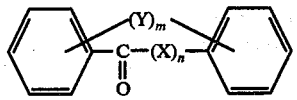

II in which X and n are as hereinbefore described, Y is $> CH_2$, or hydrocarbyl derivative thereof, and m is 0, 1 or 2. Preferably the group Y is linked to the aromatic groups in positions ortho to the group

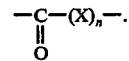

The groups A together may form a fused aromatic ring system.

Particularly preferred photosensitisers on account of the rapid rates at which the ethylenically unsaturated material may be polymerised are alpha-diketones having the structure I in which X is $> C = O$ and n is 1. In general, the alpha-diketones are capable of being excited by radiation in the visible region of the spectrum, that is, by light having a wavelength greater than 400 mμ, e.g. in the wavelength range 400 mμ to 500 mμ, although ultraviolet radiation, or a mixture of ultraviolet radiation and visible light, may be used. Suitable alpha-diketone photosensitisers include biacetyl in which both groups A are methyl, benzil in which both groups A are phenyl, alpha-diketones in which both of the groups A are fused aromatic, e.g. alpha-naphthil and beta-naphthil, and alpha-diketones in which the groups A are aralkyl groups, e.g. p-tolil. As an example of a suitable alpha-diketone photosensitiser in which the groups A are non-benzenoid aromatic there may be mentioned furil in which the groups A have the structure

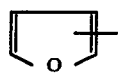

e.g. 2 : 2'-furil. In the alpha-diketone photosensitiser the groups A may carry non-hydrocarbyl groups, for example, the photosensitiser may be p,p'-dialkoxy benzil, e.g. p,p'-dimethoxy benzil, or p,p'-dihalobenzil, e.g. p,p'-dichlorobenzil, or p-nitrobenzil.

In the photosensitiser having the structure I, $n$ may be zero in which case the groups A are aromatic or substituted aromatic. An example of such a photosensitiser is benzophenone in which both the groups A are phenyl.

Further suitable photosensitisers include those having the structure I in which $n$ is 1 and X is $> CR_3OR_4$. For example, the photosensitiser may be benzoin in which $R_3$ and $R_4$ are H and both the groups A are phenyl, an alkyl benzoin in which $R_3$ is hydrogen and $R_4$ is alkyl, e.g. methyl, alpha-naphthoin and beta-naphthoin in which both the groups A are fused aromatic, p,p'-dialkoxy benzoin, e.g. p,p'-dimethoxy benzoin and p,p'-dihalobenzoin, e.g. p,p'-dichlorobenzoin, in which the groups A carry non-hydrocarbyl groups, and furoin in which the groups A are non-benzenoid aromatic and have the structure

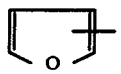

e.g. 2,2'-furoin.

In the photosensitiser the groups A may be linked together by a direct link or by a divalent hydrocarbyl group to form a cyclic ring system. For example, where the groups A are aliphatic the photosensitiser may be camphorquinone.

Where the photosensitiser has the structure II suitable photosensitisers include fluorenone in which $n$ and $m$ are both zero and the aromatic groups A are linked by a direct link ortho to the group

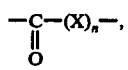

and phenanthraquinone in which X is $> C = O$, $n$ is 1, and $m$ is 0, the aromatic groups A being linked by a direct link ortho to the group

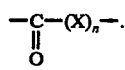

The photosensitiser may be acenaphthene quinone in which the groups A in structure I together form a fused aromatic ring system.

The photosensitiser may, for example, be present in the photopolymerisable composition in a concentration in the range 0.001% to 10% by weight of the ethylenically unsaturated material in the composition, although concentrations outside this range may be used if desired. Suitably, the photosensitiser is present in a concentration of 0.01% to 7%, and more preferably 0.5% to 5%, by weight of the ethylenically unsaturated material in the composition.

The N-alkyl or N-cycloalkyl morpholine preferably contains a lower alkyl group containing up to six carbon atoms, e.g. N-ethylmorpholine, or a cyclohexyl or methylcyclohexyl group. The concentration of the N-alkyl or cycloalkylmorpholine in the composition is suitably 0.1 to 10%, and preferably 1 to 5% by weight of the ethylenically unsaturated material in the composition.

The polymerisable ethylenically unsaturated material, which should be free-radically polymerisable, is suitably at least one monomer containing ethylenic unsaturation in a terminal group. For example, the ethylenically unsaturated material may be one or more monomers selected from vinyl monomers, allyl monomers and vinylidene monomers.

Suitable vinyl monomers which may be polymerised include, for example, vinyl esters, aromatic vinyl compounds and vinyl nitriles.

Vinyl esters suitable for use in the method of our invention include, for example, vinyl acetate and esters of acrylic acid having the structure $CH_2 = CH — COOR_7$, where $R_7$ is an alkyl, aryl, alkaryl, aralkyl or cycloalkyl group. For example, $R_7$ may be an alkyl group having from 1 to 20, and preferably 1 to 10 carbon atoms. Particular vinyl esters which may be mentioned include, for example, methyl acrylate, ethyl acrylate, n- and isopropylacrylates, and n-, iso- and tertiary butyl acrylates.

Other suitable vinyl esters include, for example, esters of the formula $CH_2 = C(R_8)COOR_7$, where $R_8$ may be methyl. In the ester of formula $CH_2 = C(R_8)COOR_7$, $R_7$ and $R_8$ may be the same or different. Particular vinyl esters which may be mentioned include, for example, methyl methacrylate, ethyl methacrylate, n- and isopropylmethacrylate, and n-, iso- and tertiary butyl methacrylate. Suitable aromatic vinyl compounds include, for example styrene and derivatives thereof, e.g. alpha-alkyl derivatives of styrene, e.g. alpha-methyl styrene, and vinyl toluene.

Suitable vinyl nitriles include, for example acrylonitrile and derivatives thereof, e.g. methacrylonitrile.

Other suitable vinyl monomers include vinyl pyrollidone, and hydroxyalkyl acrylates and methacrylates, e.g. hydroxyethyl acrylate, hydroxypropyl acrylate, hydroxyethyl methacrylate and hydroxypropylmethacrylate.

The ethylenically unsaturated material may include at least one ethylenically unsaturated polymer, suitably in combination with at least one ethylenically unsaturated monomer. For example, the ethylenically unsaturated polymer may be an ethylenically unsaturated polyester formed by condensation of at least one, preferably $C_1$ to $C_{20}$ ethylenically unsaturated polycarboxylic acid or anhydride, e.g. maleic acid, maleic anhydride, furmaric acid, itaconic acid, itaconic acid anhydride, mesaconic acid or citraconic acid, optionally in combination with at least one, preferably $C_1$ to $C_{20}$ saturated polycarboxylic acid or anhydride, e.g. ortho phthalic acid, phthalic anhydride, iso-phthalic acid, terephthalic acid, trimellitic acid, pyromellitic acid, or adipic acid, with at least one, preferably $C_1$ to $C_{50}$ polyol, e.g. ethylene glycol, propylene glycol, di- or tri-ethylene glycol, di- or tri-propylene glycol, glycerol, neopentyl glycol, pentaerythritol, dipentaerythritol, trimethylol propane, trimethylol ethane, polyethylene or polypropylene glycol.

Where the photopolymerisable composition includes a mixture of an ethylenically unsaturated polyester and an ethylenically unsaturated monomer the polyester and monomer may suitably be present in the composition in a proportion by weight of polyester: monomer of 99 : 1 to 1 : 99, preferably 90 : 10 to 10 : 90.

We have found that where the ethylenically unsaturated material in the photopolymerisable composition comprises a mixture of an ethylenically unsaturated polyester and an ethylenically unsaturated monomer, then the acceleration in the rate of polymerisation of the ethylenically unsaturated material which is obtained by including a given concentration of reducing agent in the composition is greater the lower is the acid value of the ethylenically unsaturated polyester in the composition.

The ethylenically unsaturated monomer may be, or may include, a polyfunctional monomer polymerisation of which will lead to the production of cross-linked materials. Suitable polyfunctional ethylenically unsaturated monomers include, for example, styrene, alpha-methylstyrene, vinyl toluene, diallyl phthalate, vinyl acetate, methyl methacrylate, divinyl benzene glycol dimethacrylate and a reaction product of a hydroxyalkyl acrylate or methacrylate with an isocyanate-ended adduct of a diol and a di-isocyanate, for example, a reaction product of hydroxyethyl methacrylate and an isocyanate-ended adduct of 4:4'-diphenyl methane di-isocyanate and oxypropylated bisphenol-A.

Where the ethylenically unsaturated material is a solid then it may be convenient, in order to produce a liquid composition, to include in the composition sufficient amount of a suitable diluent. The diluent should, of course, have little or no inhibiting effect on the polymerisation of the ethylenically unsaturated material in the composition.

Compositions according to the present invention may be polymerised by exposure to radiation having a wavelength which is capable of being absorbed by the photosensitiser so as to convert the photosensitiser to an excited state.

The radiation may be visible light or ultraviolet radiation or radiation which includes within its spectrum, radiation of both visible and ultraviolet wavelengths. Suitably, the radiation has a wavelength in the range 230 mµ to 600 mµ. Sunlight may be used as the source of the radiation, although the wavelength of radiation to be used will be determined by the particular photosensitiser in the composition, the radiation being of a wavelength such as to be absorbed by the photosensitiser so as to convert the photosensitiser to an excited state. A suitable wavelength may be chosen by means of simple experiment, e.g. by measuring the electronic absorption spectrum of the photosensitiser.

The compositions of our invention are suitable for the production of shaped articles of polymeric materials, for example sheets or articles made by winding of filaments, and are particularly suitable for use in the preparation of polymeric materials in the form of films and in particular paint films. Thus, as the compositions of our invention are substantially stable such that little or no polymerisation of the ethylenically unsaturated material takes place in the absence of radiation they form can-stable compositions which may be formed into a film, e.g. a paint film, and then caused or allowed to polymerise by exposure to light, e.g. by exposing the film to natural light, e.g. sunlight. When formed into a film and exposed to light the compositions rapidly polymerise.

The compositions used in the process of our invention, especially compositions which are to be used in the production of cross-linked materials, especially paint films, may contain pigments, which may be organic or inorganic.

Where the composition contains a pigment a photosensitiser should be chosen which is excited by radiation having a wavelength which is not absorbed to an excessive extent by the pigment present in the composition. Preferably, the pigment should be transparent to radiation at the wavelength which excites the photosensitiser. Where the pigment absorbs ultraviolet radiation but absorbs little or no radiation in the visible region of the spectrum those photosensitisers in the composition of our invention which are excited by visible light, for example, the alpha-diketones, are especially useful.

If desired, the composition may contain a photosensitive dye which can also act independently as a photo initiator for the polymerisation. Such dyes include rose bengal, eosein, erythrosin or phloxin.

Other additives may also be present in the photopolymerisable compositions according to the invention, e.g. antioxidants and U.V.-stabilisers.

The invention will now be further described with reference to the following Examples.

EXAMPLE 1

An unsaturated polyester resin was produced by heating a mixture of 15 moles maleic acid, 15 moles phthalic anhydride and 33 moles propylene glycol at 215° C and removing the water formed. The alkyd product which had an acid value of 32 mgm. KOH/gram, was dissolved in styrene (3.598 kilos) and 0.9217 g. hydroquinone added as antioxidant. The resulting composition had a solids content of 61% and a viscosity at 25° C of 2 poise.

Two samples of the unsaturated polyester were taken and in one was dissolved 0.25% by wt. benzil and 3.0% by wt. N-ethylmorpholine, and in the other 0.25% by wt. benzil and 3.0% by wt. triethanolamine. The samples were each split into three and all were illuminated for varying periods of time by a Thorn 400 watt lamp with maximum emission at 400 to 420 mµ. Following the irradiation each sample was evaluated by the standard Barcol harness test with the following results:

| Time of Exposure | N-ethylmorpholine | | Triethanolamine | |
| Mins. | Top | Bottom | Top | Bottom |
| --- | --- | --- | --- | --- |
| 10 | 26.6 | 5.6 | 0 | 0 |
| 20 | 40.4 | 35.4 | 0 | 0 |
| 30 | 43.2 | 36.2 | 1.8 | 0 |

(On this scale the harder the resin the greater the number recorded and, in turn, the harder the resin in a given time, the more rapid the rate of cure).

EXAMPLE 2

An unsaturated polyester resin was produced by heating a mixture of 15 moles terephthalic acid and 33 moles propylene glycol at 230° C until the calculated amount of water had been removed. 15 Moles of maleic anhydride were then added and the heating continued to produce an alkyd with an acid value of less than 13 mgm KOH/gram. The alkyd was dissolved in styrene to give a solution with a 55% by weight solids content and samples of this solution were tested using the same catalyst combination under the same conditions as in Example 1.

| Time of Exposure | N-ethylmorpholine | | Triethanolamine | |
| --- | --- | --- | --- | --- |
| Mins. | Top | Bottom | Top | Bottom |
| 10 | 24.2 | 3.4 | 10.0 | 0 |
| 20 | 41.6 | 23.8 | 34.0 | 30.2 |
| 30 | 38.4 | 33.0 | 36.0 | 29.4 |

EXAMPLE 3

Example 2 was repeated except that 10 moles terephthalic acid were first heated with 33 moles of propylene glycol and 20 moles of maleic anhydride were subsequently added. The acid value of the alkyd was less than 18 mgm KOH/gram.

Samples of the resin were evaluated using the same catalysts under the same conditions as in Examples 1 and 2 with the following results:

| Time of Exposure | N-ethylmorpholine | | Triethanolamine | |
| --- | --- | --- | --- | --- |
| Mins. | Top | Bottom | Top | Bottom |
| 10 | 24.8 | 9.2 | 17.2 | 0 |
| 20 | 34.4 | 34.6 | 31.8 | 23.0 |
| 30 | 39.6 | 39.4 | 29.8 | 31.0 |

EXAMPLE 4

COMPARATIVE EXAMPLE

Using a similar resin to that described in Example 1 a formulation was made up containing 3% by weight morpholine and 0.25% by weight of benzil. The formulation was divided into three and irradiated by the procedure described in Example 1. The Barcol hardness values were as follows:

| Time of Exposure Mins. | Top |
| --- | --- |
| 10 | 9.7 |
| 20 | 26.6 |
| 30 | 29.9 |

I claim:
1. A photopolymerisable composition which comprises an ethylenically unsaturated polyester, an ethylenically unsaturated comonomer, and a photosensitive catalyst comprising:
   (a) at least one photosensitiser which is an alpha-diketone selected from the group consisting of biacetyl, benzil, alpha-naphthil, beta-naphthil, p-tolil, furil, p,p'-dialkoxybenzil, p,p'-dihalobenzil and p-nitrobenzil, and
   (b) a reducing agent which is a N-alkyl- or N-cycloalkyl-morpholine.

2. A composition as claimed in claim 1 in which the N-alkyl or N-cycloalkyl morpholine is an N- ($C_1$ to $C_6$) alkyl morpholine, N-cyclohexylmorpholine or N-methylcyclohexylmorpholine.

3. A composition as claimed in claim 1 which comprises:
   (a) 0.001% to 10% by weight of the composition of benzil,
   (b) 0.1% to 10% by weight of the composition of an N-($C_1$ to $C_6$ alkyl)morpholine,
   (c) an ethylenically unsaturated polyester formed by the condensation of an ethylenically unsaturated dibasic acid selected from the group consisting of maleic acid, maleic anhydride, fumaric acid, itaconic acid, itaconic acid anhydride, mesaconic acid and citraconic acid with a polyhydric alcohol selected from the group consisting of ethylene glycol, propylene glycol, diethylene glycol, dipropylene glycol, triethylene glycol, tripropylene glycol, glycerol, neopentyl glycol, pentaerythritol, dipentaerythritol, polyethylene glycol and polypropylene glycol, and
   (d) an ethylenically unsaturated comonomer selected from the group consisting of styrene, alpha-methylstyrene, vinyltoluene, divinylbenzene, diallylphthalate, vinylacetate and methylmethacrylate.

4. A composition as claimed in claim 3 in which the ethylenically unsaturated polyester is also formed from a dibasic acid selected from the group consisting of orthophthalic acid, phthalic anhydride, isophthalic acid, terephthalic acid and adipic acid.

5. A process for the preparation of a polymeric material which comprises irradiating a photopolymerisable composition as claimed in claim 1 with radiation having a wavelength in the range 230 mµ to 600 mµ.

6. A composition as claimed in claim 1 in which the ethylenically unsaturated comonomer comprises a vinyl, allyl or vinylidene monomer.

* * * * *